United States Patent [19]

Park

[11] Patent Number: 5,699,114
[45] Date of Patent: Dec. 16, 1997

[54] CCD APPARATUS FOR PREVENTING A SMEAR PHENOMENON

[75] Inventor: Chan Park, Kyungki-do, Rep. of Korea

[73] Assignee: Goldstar Electron Co., Ltd., Chungchungbuk-do, Rep. of Korea

[21] Appl. No.: 425,445

[22] Filed: Apr. 20, 1995

[30] Foreign Application Priority Data

Jul. 8, 1994 [KR] Rep. of Korea ............... 16942/1994

[51] Int. Cl.$^6$ .................. H04N 9/64; H01L 27/148; H01L 29/768
[52] U.S. Cl. .................. 348/249; 348/250; 257/223; 257/229; 257/233
[58] Field of Search .................. 257/232, 233, 257/229, 230, 222, 223; 348/241, 248, 249, 250, 311, 374, 375; H04N 5/217, 9/64

[56] References Cited

U.S. PATENT DOCUMENTS

| | | |
|---|---|---|
| 5,181,093 | 1/1993 | Kawaura ............... 257/223 |
| 5,238,864 | 8/1993 | Maegawa et al. ............... 437/53 |
| 5,262,661 | 11/1993 | Kuroda et al. ............... 257/227 |
| 5,349,216 | 9/1994 | Lee et al. ............... 257/230 |
| 5,446,297 | 8/1995 | Lee ............... 257/223 |
| 5,514,887 | 5/1996 | Hokari ............... 257/222 |

*Primary Examiner*—Andrew Faile
*Assistant Examiner*—Ngoc-Yen Vu

[57] ABSTRACT

A CCD for detecting images includes a substrate, a well region formed on the semiconductor substrate, a horizontal CCD (HCCD) formed in the well region, a photodiode region formed in the well region at a prescribed spacing from the HCCD, a channel stop layer, an impurity diffusion layer which serves as a potential barrier region around the side and lower portions of the photodiode region so as to completely separate the photodiode region from the well region, a gate insulating layer formed on the substrate, a polygate formed on the gate insulating layer above the HCCD, an insulating layer formed on portions of the gate insulating layer, and a metal shielding layer formed on the insulating layer, whereby a smear phenomenum is prevented.

22 Claims, 2 Drawing Sheets

CCD APPARATUS FOR PREVENTING A SMEAR PHENOMENON

BACKGROUND OF THE INVENTION

The present invention relates to a CCD (charge coupled device) for detecting images, and more particularly to a CCD device which is appropriate for reducing smear phenomena by forming a potential barrier around a photoelectric conversion region.

Generally, a CCD for detecting images is a two-dimensional array of charge-coupled photoelectric conversion devices on a substrate of a semiconductor such as silicone, and includes a horizontal CCD decoder (hereinafter "HCCD") for transferring image signal charges formed by the photoelectric conversion devices arranged in the horizontal direction, a vertical CCD decoder (hereinafter "VCCD") for sequentially transferring different rows of image signal charges transferred by the HCCD decoder, and a sensing amplifier for sensing the transferred image signal charges.

A method for manufacturing a conventional CCD for detecting images will be described in detail below with reference to the attached drawing.

In FIG. 1, reference numerals 1–10 are summarized as follows:

1: N-type semiconductor substrate
2: low concentration P-type well
3: HCCD region
4: photo diode region
5: gate insulating layer
6: polygate
7: insulating layer
8: metal shielding layer
9: PDP region
10: signal charge In addition, the circled minus signs adjacent reference numeral 10 indicate signal charges incident to the photo diode region.

As shown in FIG. 1, which is a sectional view of a conventional CCD for detecting images, a $P^-$-type well region 2 of low impurity concentration is formed on an N-type semiconductor substrate 1, and an $N^+$-type photodiode region 4 of high impurity concentration and an $N^+$-type HCCD 3 of high impurity concentration are formed at a prescribed spacing from each other in the P-type well region 2 of low impurity concentration.

The $N^+$-type photodiode region 4 of high impurity concentration is formed by ion implantation of a high concentration of an N-type impurity into a $P^-$-type well region 2 of low impurity concentration. On the surface of the photodiode region 4, a $P^+$-type layer 9 of high impurity concentration for potential barrier formation is manufactured so as to form a double P-N junction consisting of PNPN.

In FIG. 1, only a single photodiode region 4 and a single HCCD 3 are illustrated and labelled in the P-type well region 2 of low impurity concentration. However, multiple photodiode regions 4 and multiple HCCD's 3 are actually formed in the $P^-$-type well region 2 of low impurity concentration.

Subsequently, a gate insulating layer 5 is formed on the entire substrate and a polygate 6 is formed on the gate insulating layer 5 above each HCCD 3. An insulating layer 7 is formed on the gate insulating layer 5 and polygate 6 but not over the photodiode regions 4. A metal shielding layer 8 is formed on the insulating layer 7 but not over the photo- diode regions 4 so as to prevent irradiation of light to regions other than the photodiode regions 4.

The operation of a conventional CCD formed through the above-mentioned process is as follows.

When light irradiates the photodiode regions 4, image-wise charges are produced at the photodiode regions 4 of the P-N junction structure and are accumulated there.

The accumulated image-wise charges at the photodiode regions 4 are transferred to the respective HCCD 3 by transfer signals applied to the polygate 6.

However, in the above-mentioned conventional CCD, when light irradiates the photodiode regions 4, the produced charges are not limited to those caused by the direct irradiation of the photodiode regions 4. Charges are also produced in the P-type well region 2 of law impurity concentration by irregular reflection of the light. These charges produced by the irregular reflection of light become noise signals when the image-wise charges at the photodiode regions 4 are detected.

That is, since the potential barrier at the $P^-$-type well region 2 of low impurity concentration is low (as shown in FIG. 2), the signal charges produced at each $P^-$-type well region 2 of low impurity concentration are input to the respective photodiode regions 4. These noise signals are transferred to the HCCD 3 (FIG. 1) with the image signal charges produced at the respective photodiode regions 4, and are passed to the VCCD (not shown in FIG. 1) and the sensing amplifier (not shown in FIG. 1) 50 to produce an image. Accordingly, a problem of smear phenomenon (i.e. image spreading) occurs.

SUMMARY OF THE INVENTION

To solve the above-mentioned problem, an object of the present invention is to provide a CCD for detecting images in which such a smear phenomena is reduced by preventing input of signal charges due to the irregular reflection of light into the photodiode regions.

To achieve the above object of the invention, there is provided a CCD for detecting an image, comprising a first-conductivity type semiconductor substrate, a second-conductivity type well region of low impurity concentration formed on the semiconductor substrate, a second-conductivity type HCCD of high impurity concentration formed in the second-conductivity type well region of low impurity concentration, a photodiode region formed of high impurity concentration of the second-conductivity type and formed in the well region at a prescribed distance from the HCCD, a channel stop layer of the second-conductivity type with high impurity concentration, and an impurity diffusion layer of the second-conductivity type with high impurity concentration which serves as a potential barrier region and is formed on the upper portion and side portions, respectively, of the photodiode regions. Also, an impurity diffusion layer of the second-conductivity type is formed in the well region of low impurity concentration, which wraps each photodiode region, the associated impurity diffusion layer of the second-conductivity type of high impurity concentration, and the channel stop region. Further, a gate insulating layer is formed on the entire surface of the substrate, and a polygate is formed on the gate insulating layer above each HCCD region. Finally, an insulating layer is formed on the gate insulating layer so as to wrap each polygate but not cover the respective associated photodiode region, and a metal shielding layer is formed so as to wrap the gate insulating layer but not cover the respective associated photodiode region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and advantages of the present invention will become more apparent from reading the below detailed description of a preferred embodiment of the invention thereof with reference to the attached drawings in which.

DETAILED DESCRIPTION OF THE PREFERRED EMBODIMENTS

Figure 1:
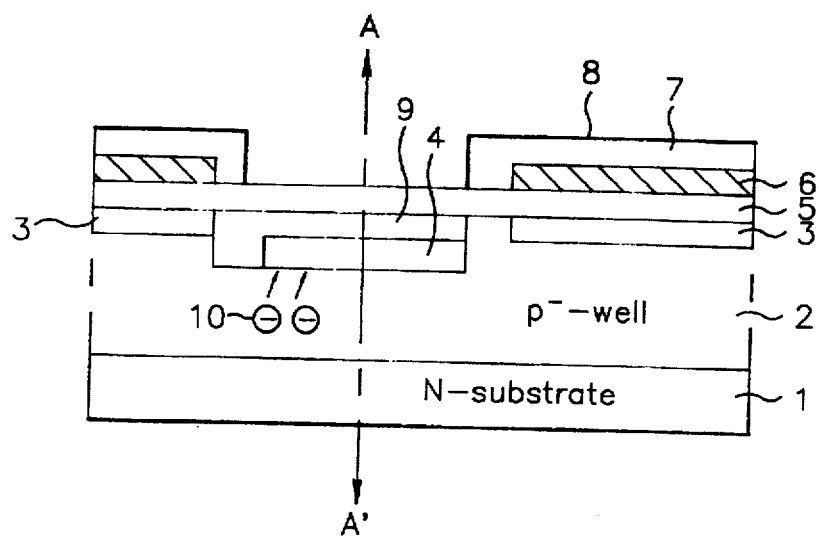
FIG. 1 is a structural sectional view of a conventional CCD for detecting images.
Figure 2:
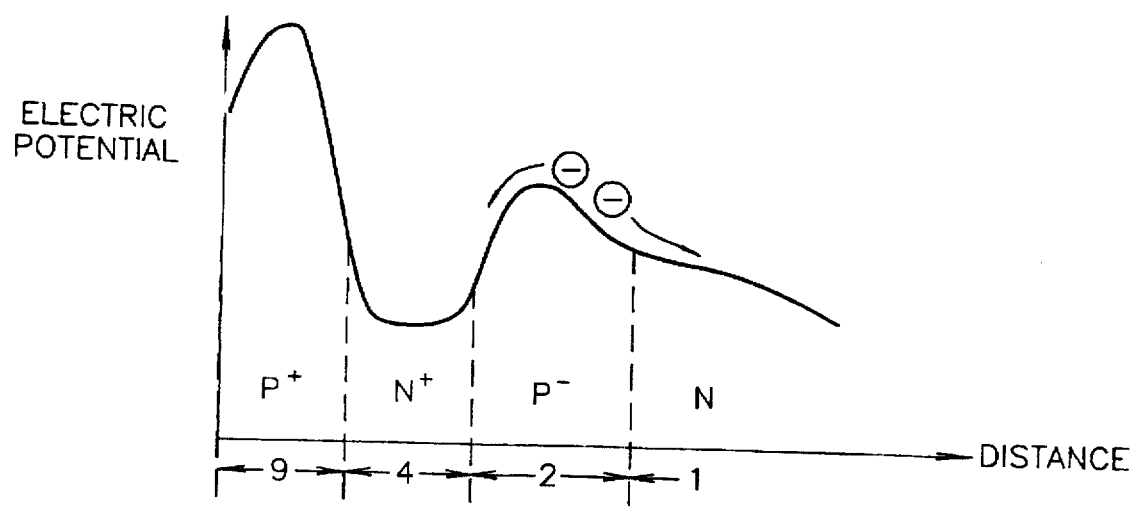
FIG. 2 shows the electric potential distribution of the conventional CCD cut along the line of A–A' in FIG. 1.
Figure 3:
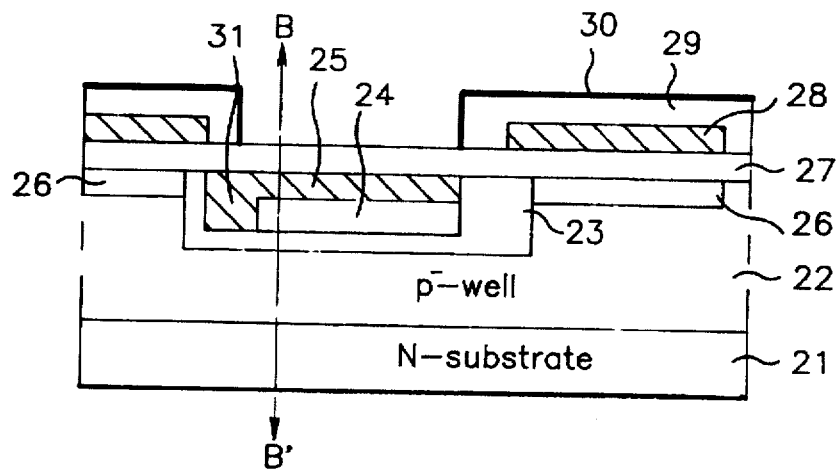
FIG. 3 is a structural sectional view of a CCD for detecting images according to an embodiment of the present invention.

FIG. 3 is a structural sectional view of a CCD for detecting images according to an embodiment of the invention.

The CCD for detecting images according to the present invention includes an N-type semiconductor substrate 21, a P$^-$-type well region 22 of low impurity concentration formed on the N-type semiconductor substrate 21, an N$^+$-type photodiode region 24 of high impurity concentration formed in the P$^-$-type well region 22 of low impurity concentration, a HCCD region 26 formed in the P$^-$-type well region 22 of low impurity concentration so as to maintain a prescribed spacing with the photodiode region 24, a P$^+$-type layer 25 of high impurity concentration for potential barrier formation formed on the surface of the photodiode region 24, a P-type impurity diffusion layer 23 for preventing smear, formed so as to wrap the N$^+$-type photodiode region 24 of high impurity concentration and P$^+$-type layer 25 of high impurity concentration in the P$^-$-type well region 22 of low impurity concentration, a gate insulating layer 27 formed on the entire substrate, a polygate 28 for transferring signals formed on the gate insulating layer 27 opposite to the HCCD region 26, an insulating layer 29 formed on the gate insulating layer 27 so as to wrap the polygate 28 but leave uncovered a region above the photodiode region 24, and a metal shielding layer 30 formed on the surface of the insulating layer 29 but not over the photodiode region 24, as shown in FIG. 3.

The CCD of the present invention further includes a P$^+$-type channel stop region 31 formed on the side of the photodiode region 24 in the P-type impurity diffusion layer 23.

A method for manufacturing a CCD for detecting images according to the present invention having the above-mentioned structure will be described below.

First, a P$^-$-type well region 22 of low impurity concentration is formed in the N-type semiconductor substrate 21 by ion implantation of a low concentration of P-type impurity into the N-type semiconductor substrate 21, and the HCCD 26 is formed in the P$^-$-type well region 22 of low impurity concentration.

Then, a P-type impurity diffusion layer 23 is formed by implanting P-type impurities, using a high energy ion implantation equipment, into the P$^-$-type well region 22 of low impurity concentration between the HCCDs 26 so as to have a wider width than the subsequently-formed photodiode region 24.

Then, the photodiode region 24 is formed by ion implantation of N$^+$-type impurity of high concentration into the P-type impurity diffusion layer 23.

Then, a channel stop layer 31 is formed on the side of the photodiode region 24 by ion implantation of a P$^+$-type impurity of high concentration into the photodiode region 24, and a P$^+$-type layer 25 of high impurity concentration is formed on the surface of the photodiode region 24. Therefore, the structure (from the layer 25 to the region 22) is made to have a PNPP structure on the N-substrate 21.

The gate insulating layer 27, including of ONO (oxide-nitride-oxide), is formed by successively depositing an oxide layer, a nitride layer and an oxide layer on the substrate, and the polygate 28 is then formed on each portion of the gate insulating layer 27 which is respective HCCD 26.

The insulating layer 29 is formed on the gate insulating layer 27 so as to wrap the polygate 28, but is not formed above the photodiode region 24. The metal shielding layer 30 is formed on the surfaces of insulating layer 29 to prevent irradiation of light onto the HCCD 26, but is not formed above the photodiode region 24 thereto.

Figure 4A:
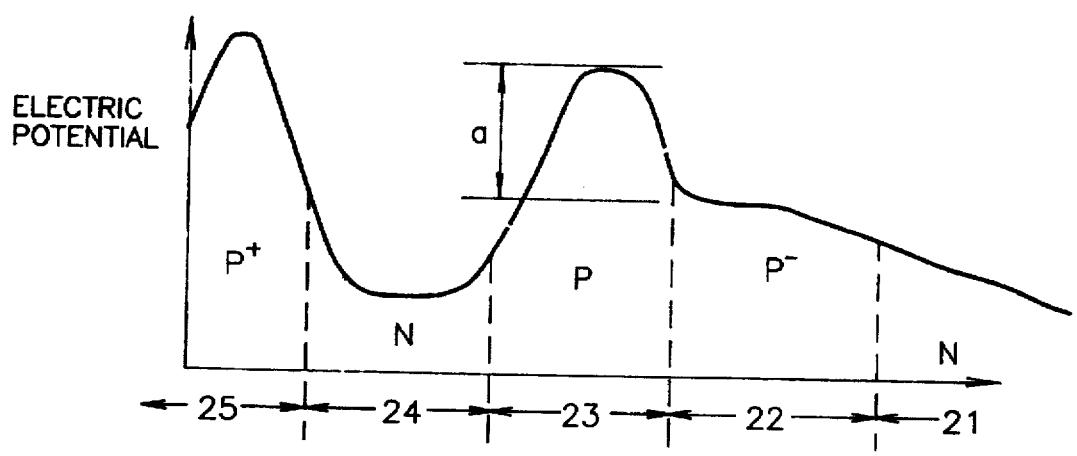
FIGS. 4A and 4B show the electric potential distribution and dose profile of each region cut along the line B–B' in FIG. 3, respectively.
Figure 4B:
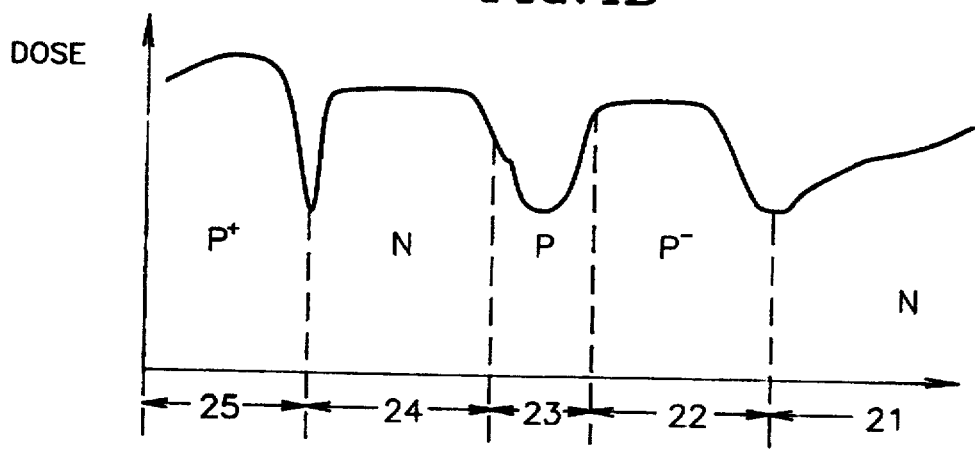

FIGS. 4A and 4B show examples of the electric potential distribution and dose profile of each region cut along the line B–B' in FIG. 3.

As illustrated in FIGS. 4A and 4B, since a the P-type impurity diffusion layer 23 is formed around the photodiode region 24 (i.e., a photoelectric conversion region plays the role of a potential barrier layer,), a potential "a" than which is higher than that formed in the conventional CCD for is formed. Therefore, although noise charges are produced in the P$^-$-type well region 22 by the irregular reflection of light, etc., the noise charges do not transfer to the photodiode regions 24 due to the potential barrier formed by the P-type impurity diffusion layer 23. Instead, the noise charges are passed to the semiconductor substrate 21.

Accordingly, smear phenomenon is prevented by restraining the transfer of charges which are not due to the image signals to the photodiode regions 24.

According to the present invention as described above, inflow of noise charges into the photodiode regions can be prevented by forming a potential barrier region around the photodiode regions. Thus, even if noise charges are produced in the P$^-$-well regions by the irregular reflection of light, a smear phenomenon is prevented from occurring, and this results in an improvement of the resolution of the CCD device.

What is claimed is:

1. A CCD apparatus for detecting images, comprising:

a first-conductivity type semiconductor substrate;

a second-conductivity type well region, of low impurity concentration, formed on said first-conductivity type semiconductor substrate;

a first-conductivity type transfer CCD formed in said second-conductivity type well region;

a first-conductivity type photodiode region formed in said second-conductivity type well region;

a second-conductivity type channel stop layer and a first second-conductivity type impurity diffusion layer formed on a side portion and an upper portion of said first-conductivity type photodiode region, respectively; and a second second-conductivity type impurity diffusion layer wrapping said first-conductivity type photodiode region and said second-conductivity type channel stop layer so as to completely separate said first-conductivity type photodiode region from said second-conductivity type well region of low impurity concentration.

2. A CCD apparatus for detecting images as claimed in claim 1, further comprising:

an insulating layer formed of oxide-nitride-oxide on said substrate.

3. A CCD apparatus as claimed in claim 1, further comprising:

a gate insulating layer formed on said substrate;

a polygate formed on said gate insulating layer above said first-conductivity type transfer CCD;

an insulating layer formed on said gate insulating layer; and a metal shielding layer formed on said insulating layer.

4. A CCD apparatus as claimed in claim 1, wherein the first-conductivity type is an N type conductivity and the second-conductivity type is a P type conductivity.

5. A CCD apparatus as claimed in claim 1, wherein the first-conductivity type transfer CCD and the first-conductivity type photodiode region are of high impurity concentration.

6. A CCD apparatus as claimed in claim 1, wherein said second impurity diffusion layer functions as a barrier potential for preventing transfer of charges from said well region into said photodiode region, whereby a smear phenomenon is prevented.

7. A CCD apparatus as claimed in claim 1, wherein said first-conductivity type transfer CCD is a horizontal CCD.

8. A CCD apparatus comprising:

a substrate of a first-conductivity type;

a well region of a second-conductivity type formed on said substrate, said well region having a low impurity concentration;

first and second transfer CCDs of the first-conductivity type formed in said well region;

a photodiode region of the first-conductivity type formed in said well region between said first and second transfer CCDs;

a first impurity diffusion layer of the second-conductivity type wrapping said photodiode region so as to completely separate said photodiode region from said well region; and an insulating layer formed on said photodiode region.

9. A CCD apparatus of claim 8, wherein said first impurity diffusion layer functions as a barrier potential for preventing transfer of charges from said well region into said photodiode region.

10. A CCD apparatus of claim 8, wherein said first impurity diffusion layer prevents a smear phenomenon.

11. A CCD apparatus of claim 8, wherein said first impurity diffusion layer completely wraps the sides and bottom of said photodiode region.

12. A CCD apparatus of claim 8, further comprising:

a channel stop layer formed on a side portion of said photodiode region, said first impurity diffusion layer wrapping said channel stop layer; and a second impurity diffusion layer formed on said photodiode region, said first impurity diffusion layer completely wrapping the sides and bottom of said second impurity diffusion layer.

13. A CCD apparatus of claim 12, further comprising:

a polygate formed on said insulating layer;

another insulating layer formed over said polygate; and a metal shielding layer formed over said another insulating layer.

14. A CCD apparatus of claim 8, wherein said insulating layer is formed of oxide-nitride-oxide.

15. A CCD apparatus of claim 8, wherein said first-conductivity type is an n-type and said second-conductivity type is a p-type.

16. A CCD apparatus of claim 8, wherein said transfer CCDs and said photodiode region are of high impurity concentration.

17. A method of forming a CCD for detecting images, comprising the steps of, forming a substrate of a first-conductivity type;

forming a well region of a second-conductivity type on said substrate, said well region having a low impurity concentration;

forming first and second transfer CCDs of the first-conductivity type in said well region;

forming a photodiode region of the first-conductivity type in said well region between said first and second transfer CCDs;

wrapping said photodiode region with a first impurity diffusion layer of the second-conductivity type so as to completely separate said photodiode region from said well region; and forming an insulating layer on said photodiode region.

18. A method of claim 17, wherein said first impurity diffusion layer functions as a barrier potential for preventing transfer of charges from said well region into said photodiode region.

19. A method of claim 17, wherein said first impurity diffusion layer prevents a smear phenomenon.

20. A method of claim 17, wherein said wrapping step includes the step of:

completely wrapping the sides and bottom of said photodiode region with said first impurity diffusion layer.

21. A method of claim 17, further comprising the steps of:

forming a channel stop layer on a side portion of said photodiode region, said first impurity diffusion layer wrapping said channel stop layer; and forming a second impurity diffusion layer on said photodiode region, said first impurity diffusion layer completely wrapping the sides and bottom of said second impurity diffusion layer.

22. A method of claim 21, further comprising the steps of:

forming a polygate on said insulating layer;

forming another insulating layer over said polygate; and forming a metal shielding layer over said another insulating layer.

* * * * *